United States Patent
Lim et al.

(10) Patent No.: US 10,622,338 B2
(45) Date of Patent: Apr. 14, 2020

(54) LIGHT-EMITTING ELEMENT PACKAGE AND DISPLAY DEVICE HAVING SAME

(71) Applicant: LG INNOTEK CO., LTD., Seoul (KR)

(72) Inventors: Chang Man Lim, Seoul (KR); Sang Hoon Lee, Seoul (KR); Hwan Hee Jeong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/078,973

(22) PCT Filed: Feb. 23, 2017

(86) PCT No.: PCT/KR2017/002014
§ 371 (c)(1),
(2) Date: Aug. 22, 2018

(87) PCT Pub. No.: WO2017/146493
PCT Pub. Date: Aug. 31, 2017

(65) Prior Publication Data
US 2019/0067255 A1 Feb. 28, 2019

(30) Foreign Application Priority Data
Feb. 23, 2016 (KR) .................. 10-2016-0021555

(51) Int. Cl.
*H01L 25/075* (2006.01)
*H01L 33/48* (2010.01)
(Continued)

(52) U.S. Cl.
CPC ........ *H01L 25/0753* (2013.01); *H01L 33/486* (2013.01); *H01L 33/52* (2013.01); *H01L 33/62* (2013.01); *G09F 9/33* (2013.01)

(58) Field of Classification Search
CPC ........................... H01L 25/0753; H01L 33/08
See application file for complete search history.

(56) References Cited

U.S. PATENT DOCUMENTS

2003/0234404 A1* 12/2003 Matsuoka ............. H01L 27/153
257/103
2006/0274524 A1* 12/2006 Chang ....................... F21K 9/00
362/231
(Continued)

FOREIGN PATENT DOCUMENTS

JP      10-12926 A       1/1998
JP      2012-015148 A    1/2012
(Continued)

OTHER PUBLICATIONS

International Search Report (PCT/ISA/210) issued in PCT/KR2017/002014, dated May 31, 2017.

*Primary Examiner* — Matthew L Reames
*Assistant Examiner* — John A Bodnar
(74) *Attorney, Agent, or Firm* — Birch, Stewart, Kolasch & Birch, LLP

(57) ABSTRACT

An embodiment relates to a light emitting element package and display device. The light emitting element package according to the embodiment comprises: a substrate; a first light emitting element disposed on the substrate and emitting a red wavelength; a second light emitting element disposed in parallel with the first light emitting element in a first direction and emitting a blue or green wavelength; a third light emitting device disposed in parallel with the first and second light emitting elements in a second direction that is orthogonal to the first direction and emitting a green or blue wavelength; and a molding part covering the first to third light emitting elements, wherein a first upper electrode connected to the first light emitting element, a second upper electrode connected to the second light emitting element, a third upper electrode connected to the third light emitting element, and a fourth upper electrode commonly connected to the first to third light emitting elements are included on the substrate, the first to third light emitting elements are (Continued)

arranged to be misaligned in the first direction, and the centers of the first to third light emitting elements can be arranged within a curvature range having a curvature radius of 250 μm from the center of the substrate. The light emitting element package according to the embodiment can provide full colors, implement uniform color and uniform brightness, and increase a bonding force between the molding part and the substrate. In the embodiment, a configuration can be simplified and slimness can be implemented.

17 Claims, 10 Drawing Sheets

(51) Int. Cl.
*H01L 33/52* (2010.01)
*H01L 33/62* (2010.01)
*G09F 9/33* (2006.01)

(56) References Cited

U.S. PATENT DOCUMENTS

| | | |
|---|---|---|
| 2010/0277919 A1 | 11/2010 | Okada et al. |
| 2011/0006334 A1* | 1/2011 | Ishii .................... C09K 11/584 257/98 |
| 2011/0316014 A1 | 12/2011 | Hiroyuki |
| 2012/0074441 A1 | 3/2012 | Seo et al. |
| 2013/0264592 A1* | 10/2013 | Bergmann .............. H01L 33/50 257/88 |
| 2013/0285077 A1 | 10/2013 | Kojima et al. |
| 2014/0048825 A1 | 2/2014 | Hsieh et al. |
| 2014/0183572 A1* | 7/2014 | Kim .................... H01L 25/0753 257/88 |
| 2015/0340546 A1 | 11/2015 | Suzuki et al. |
| 2015/0380607 A1* | 12/2015 | Wu ........................ H01L 33/08 257/89 |
| 2016/0197310 A1* | 7/2016 | Kubota ............... H01L 51/5281 313/512 |
| 2016/0293811 A1* | 10/2016 | Hussell ............. H01L 25/0753 |

FOREIGN PATENT DOCUMENTS

| | | |
|---|---|---|
| JP | 2013-232477 A | 11/2013 |
| KR | 20-0364703 Y1 | 10/2004 |
| KR | 10-1039974 B1 | 6/2011 |
| KR | 10-2012-0031343 A | 4/2012 |

* cited by examiner

[Figure 1]
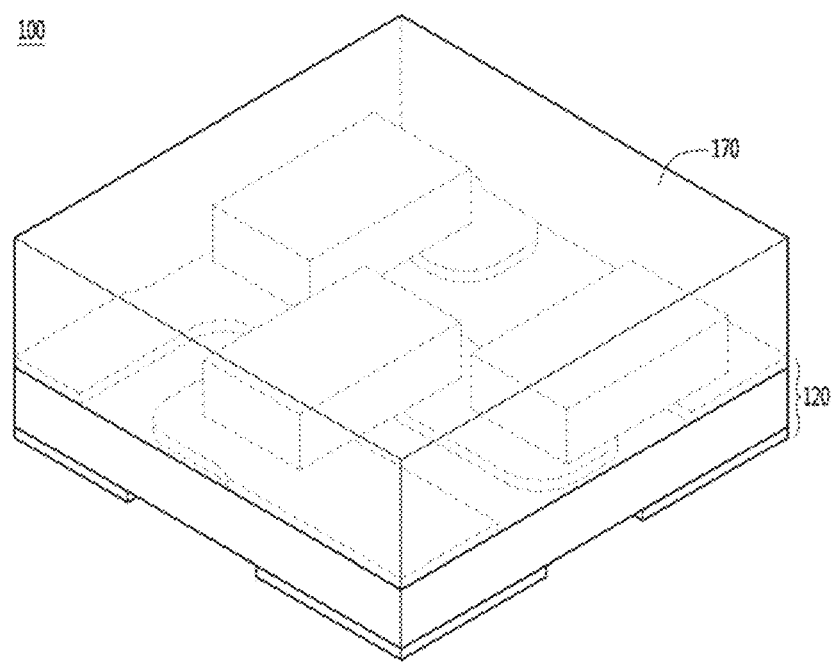

[Figure 2]
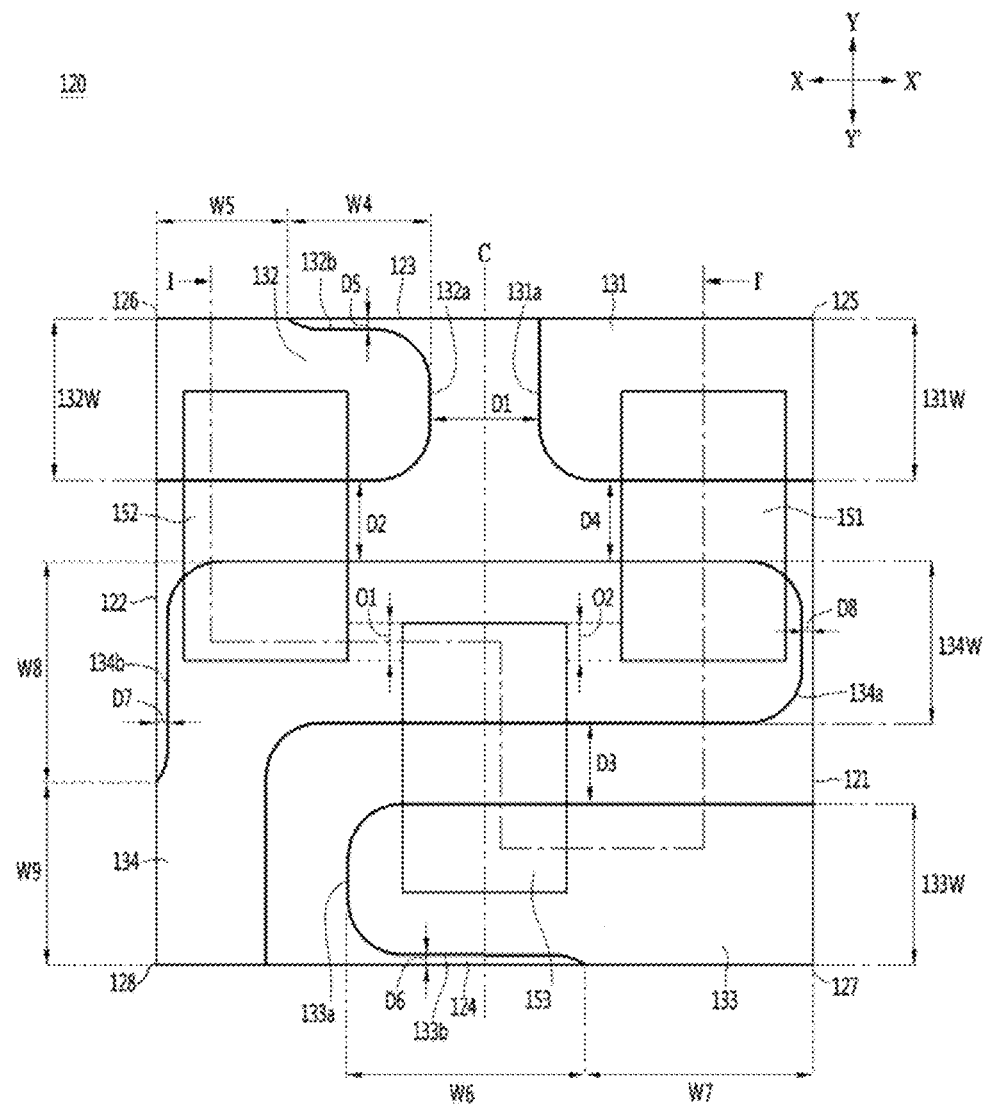

【Figure 3】
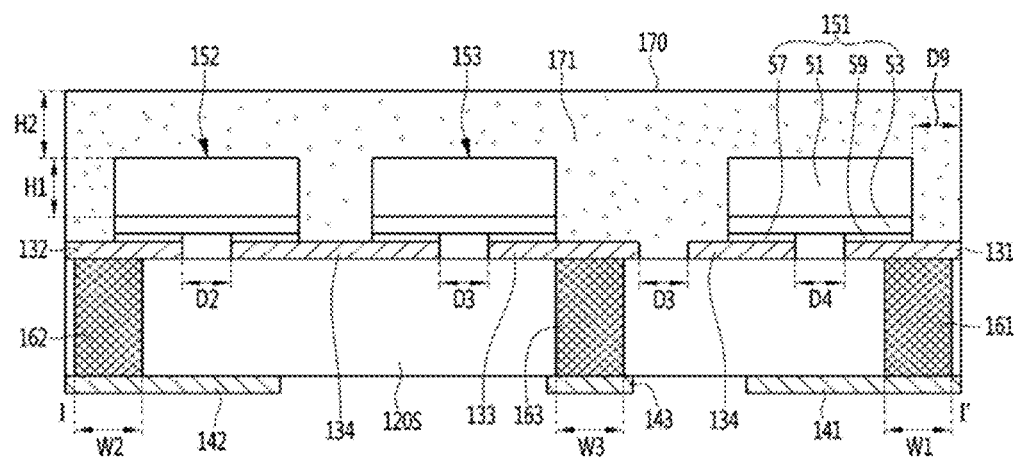
【Figure 4】
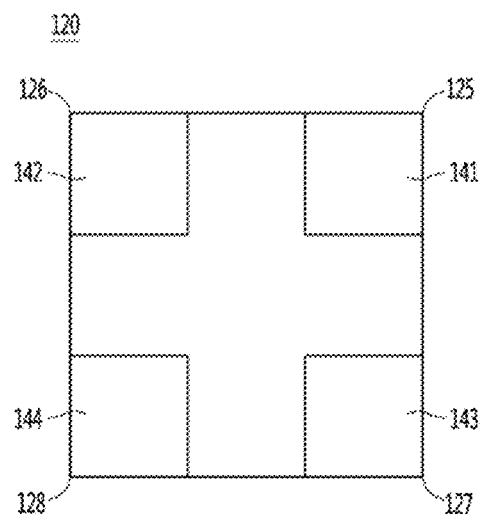

[Figure 5]
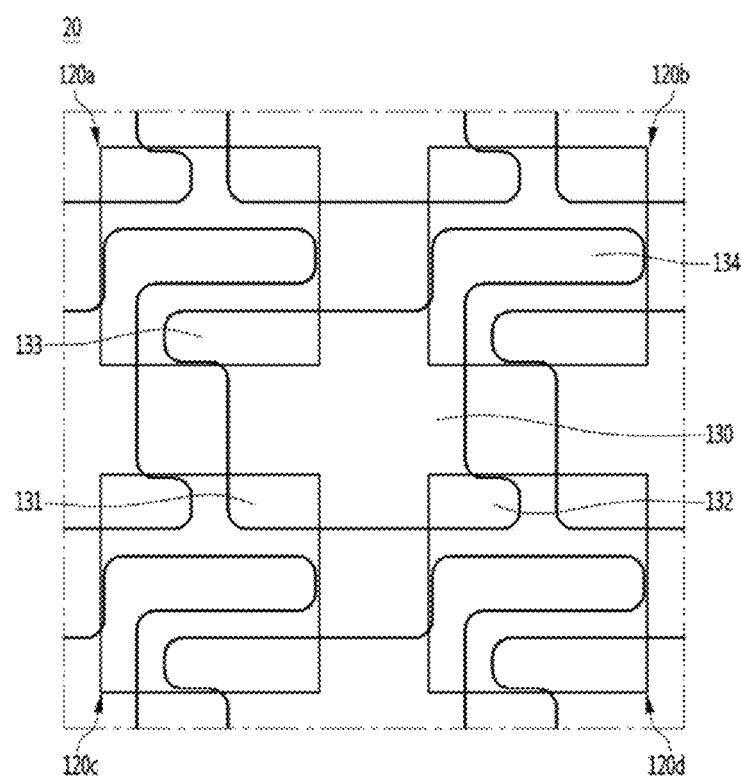

[Figure 6]
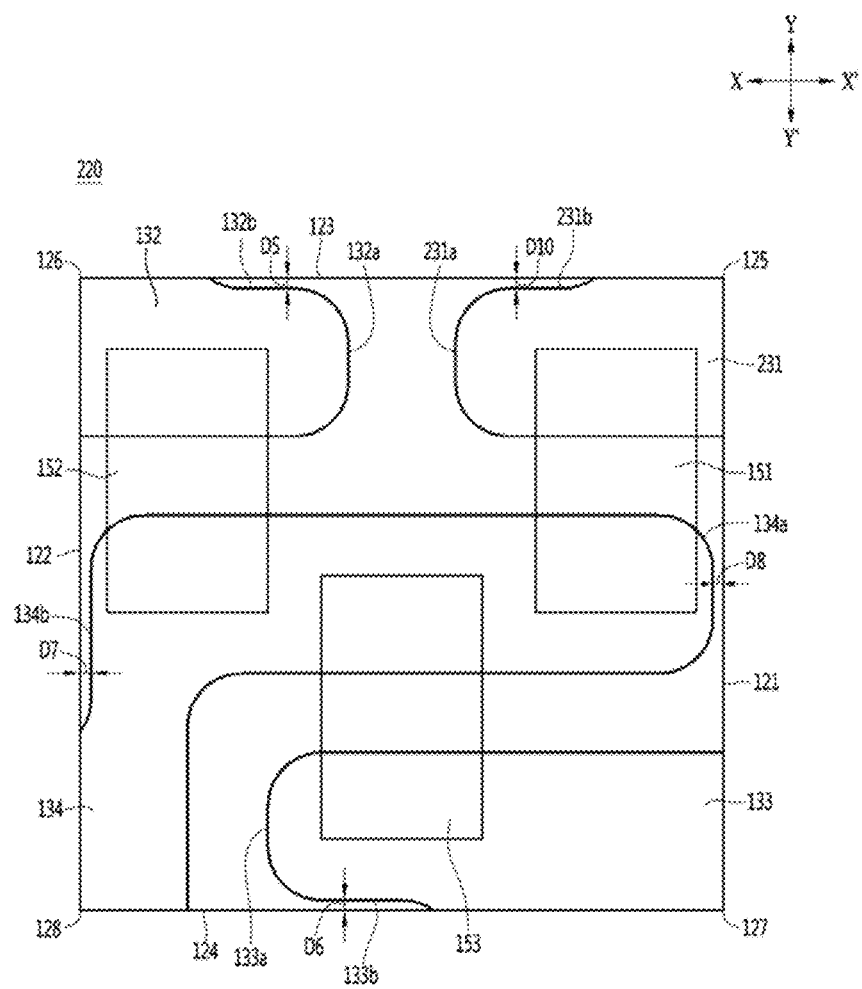

[Figure 7]
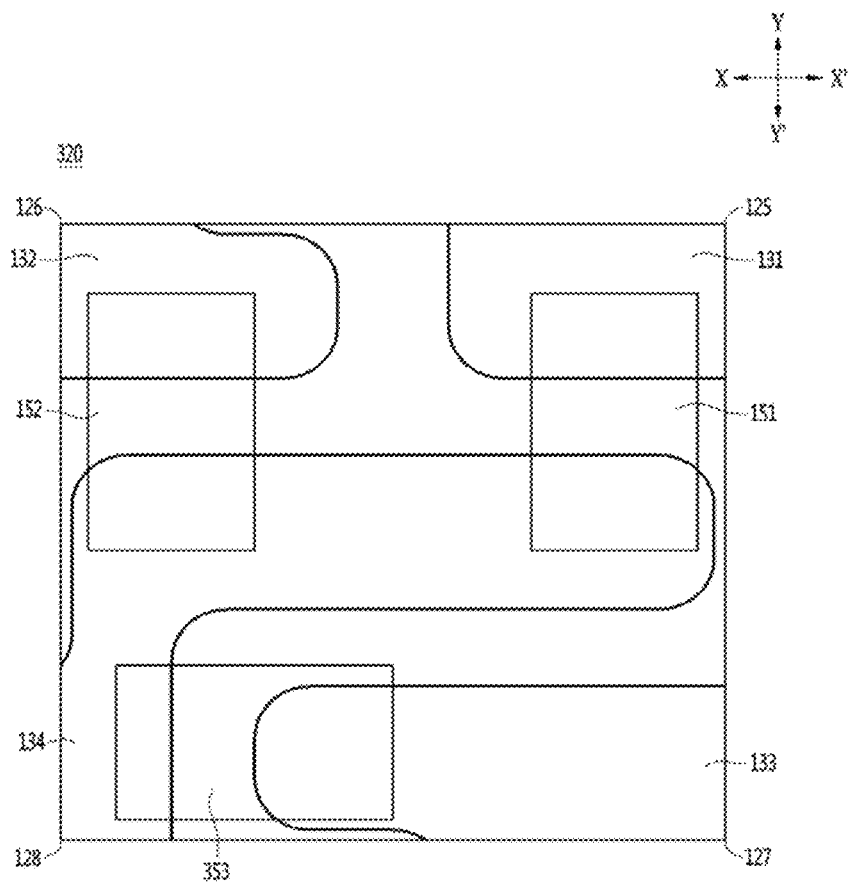

[Figure 8]
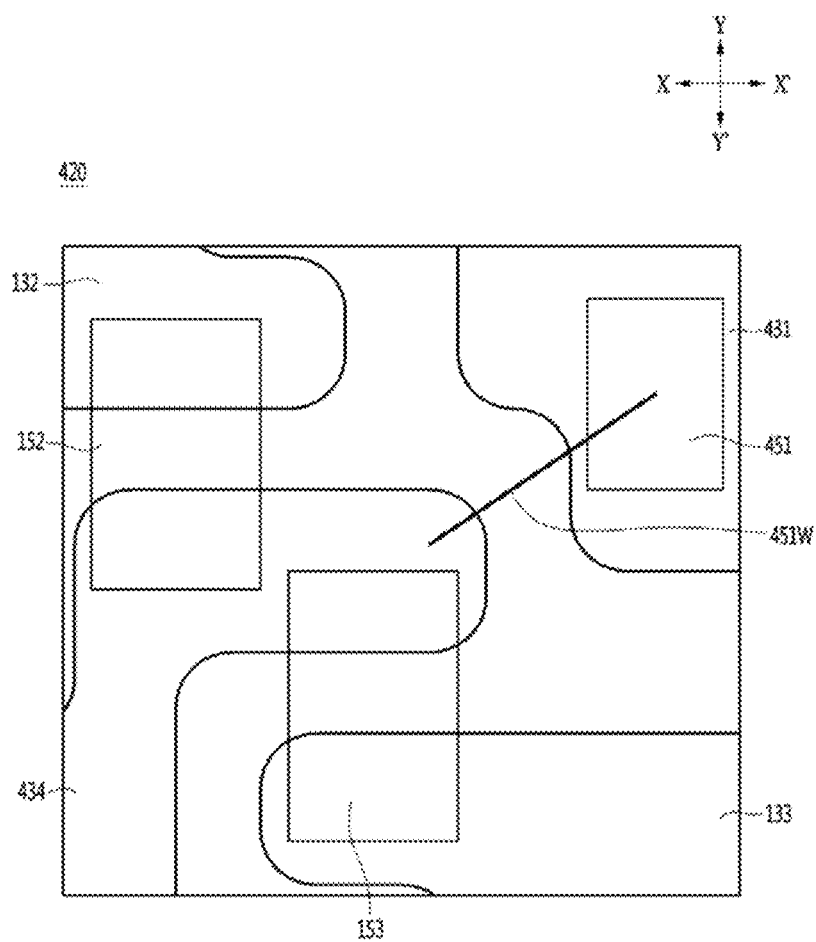

[Figure 9]
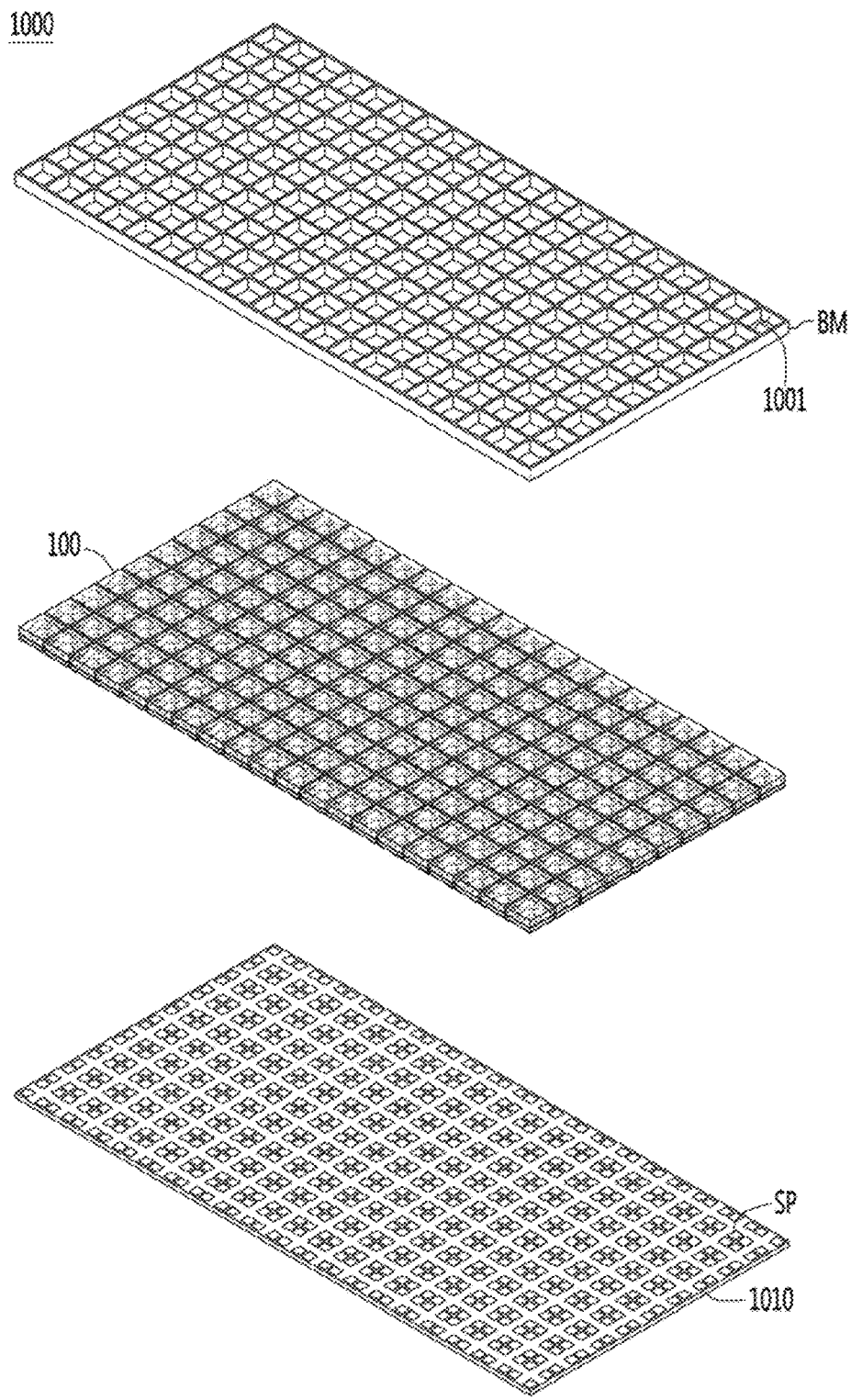

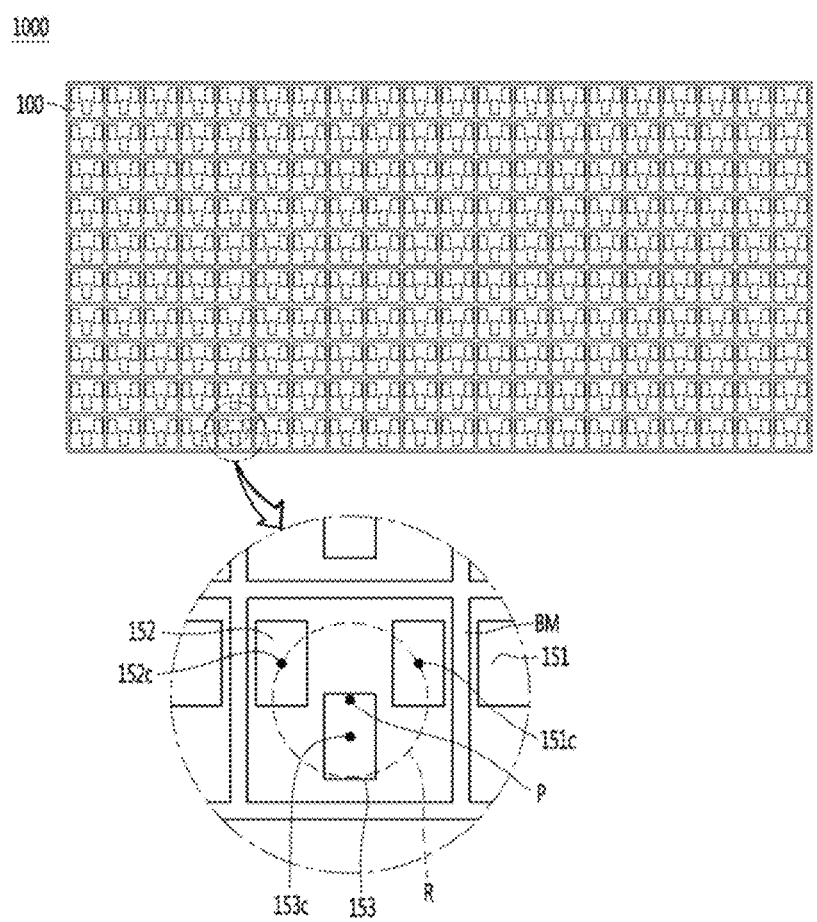
[Figure 10]

[Figure 11]
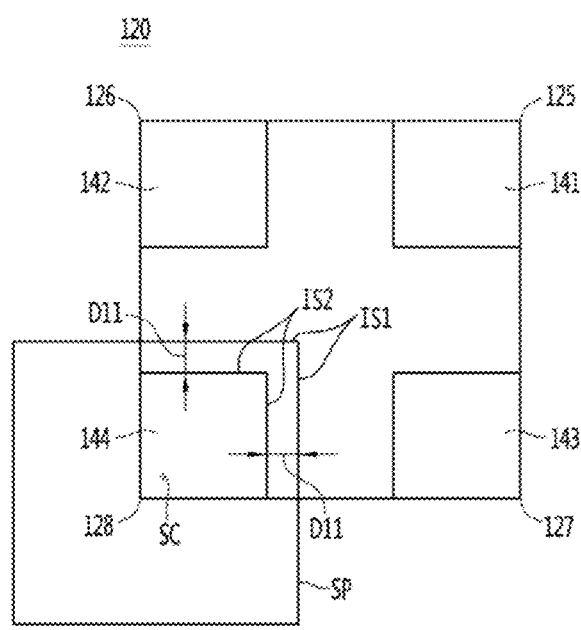

LIGHT-EMITTING ELEMENT PACKAGE AND DISPLAY DEVICE HAVING SAME

CROSS REFERENCE TO RELATED APPLICATIONS

This application is the National Phase of PCT International Application No. PCT/KR2017/002014, filed on Feb. 23, 2017, which claims priority under 35 U.S.C. 119(a) to Patent Application No. 10-2016-0021555, filed in the Republic of Korea on Feb. 23, 2016, all of which are hereby expressly incorporated by reference into the present application.

TECHNICAL FIELD

An embodiment relates to a light emitting device package and a display device.

BACKGROUND ART

A light emitting device (LED) is a p-n junction diode having a characteristic in which electric energy is converted into light energy, and may be produced by a compound semiconductor of Group III and Group V elements or the like on the periodic table, and may represent various colors by adjusting a composition ratio of a compound semiconductor.

In a LED, when a forward voltage is applied, electrons of an n layer are combined with holes of a p layer, and energy corresponding to band gap energy between a conduction band and a valence band may be generated. And, this energy is mainly emitted in the form of heat or light, and when the energy is emitted in the form of light, the LED functions.

For example, a nitride semiconductor has received a great interest in a development field of an optical device and a high-output electronic device due to high thermal stability and wide band gap energy thereof. In particular, a blue LED, a green LED and an ultraviolet (UV) LED using the nitride semiconductor are commercialized and used widely.

Recently, the brightness problem of a light emitting diode has significantly been improved, so that the LED is applied to various devices such as a backlight unit of a liquid crystal display device, an electric signage, a display device, and home appliances, etc.

A general liquid crystal display device displays images or videos with light passing through a color filter by controlling the transmission ratio of light of a plurality of LED packages in which a light emitting diode is mounted and liquid crystal.

Recently, high definition above an HD class and display devices over 100 inches have been required, but a liquid crystal display device and an organic light emitting display device having complex configurations that are typically used mainly, have been had difficulty in implementing display devices over 100 inches with high definition due to yield and cost.

DISCLOSURE

Technical Problem

An embodiment is directed to providing a light emitting device package and a display device capable of providing full color.

An embodiment is directed to providing a light emitting device package and a display device capable of implementing uniform color and uniform brightness.

An embodiment is directed to providing a light emitting device package and a display device capable of simplifying a configuration and advantageous for slimness.

An embodiment is directed to providing a light emitting device package and a display device capable of improving reliability by improving bonding force between components.

An embodiment is directed to providing a display device with excellent linearity of images and videos.

An embodiment is directed to providing a display device capable of implementing a large-sized display device with high-resolution.

An embodiment is directed to providing a display device with excellent color purity and color reproduction.

Technical Solution

A light emitting device package according to an embodiment includes: a substrate; a first light emitting device disposed on the substrate and emitting a red wavelength; a second light emitting device disposed in parallel with the first light emitting device in a first direction and emitting a blue or green wavelength; a third light emitting device disposed in parallel with the first and second light emitting devices in a second direction that is orthogonal to the first direction and emitting a green or blue wavelength; and a molding part covering the first to third light emitting devices, wherein a first upper electrode connected to the first light emitting device, a second upper electrode connected to the second light emitting device, a third upper electrode connected to the third light emitting device, and a fourth upper electrode commonly connected to the first to third light emitting devices are included on the substrate, and the first to third light emitting devices are disposed to be misaligned in the first direction, and the centers of the first to third light emitting devices are disposed within a curvature range having a curvature radius of 250 μm from the center of the substrate. The light emitting device package according to the embodiment may provide full color and implement uniform color and uniform brightness, and also increase a bonding force between the molding part and the substrate. The embodiment may simplify a configuration and may implement slimness.

A display device according to an embodiment includes: a plurality of light emitting device packages including the light emitting device package; a driving substrate electrically connected to the plurality of light emitting device packages; and a black matrix having a matrix structure surrounding an outer side surface of the plurality of light emitting device packages. The display device according to the embodiment may simplify a configuration and be advantageous for slimness, and may have excellent linearity of images and videos and may implement high-resolution in a large-sized display device over 100 inches. The embodiment may implement a display device with excellent color purity and color reproduction.

Advantageous Effects

An embodiment may provide full color by individual operations of first to third light emitting devices of a flip chip type.

In an embodiment, first to third light emitting devices having the same height include a sapphire substrate of 100 μm or less, and it is possible to implement slimness by a thickness of a molding part on the light emitting device having a height lower than that of the sapphire substrate and volume light emission. In addition, the embodiment may implement uniform color and uniform brightness by the above-described structure.

An embodiment may improve a bonding force between a molding part and a substrate by an upper electrode structure having sides spaced apart at a predetermined distance from an outer side surface of the substrate, thereby improving reliability.

A display device according to an embodiment may simplify a configuration and may have an advantage for slimness.

A display device according to an embodiment may implement high resolution in a large-sized display device over 100 inches due to excellent linearity of images and videos.

A display device according to an embodiment may implement a display device with excellent color purity and color reproduction by implementation of images and videos by a light emitting device package providing full color.

DESCRIPTION OF DRAWINGS

FIG. 1 is a perspective view illustrating a light emitting device package of a first embodiment.

FIG. 2 is a plan view illustrating a substrate and a plurality of light emitting devices of the first embodiment.

FIG. 3 is a sectional view illustrating a light emitting device package taken along a line I-I' of FIG. 2.

FIG. 4 is a plan view illustrating a lower surface of the substrate of the first embodiment.

FIG. 5 is a plan view illustrating a base substrate manufacturing an unit substrate of the first embodiment.

FIG. 6 is a plan view illustrating a light emitting device package of a second embodiment.

FIG. 7 is a plan view illustrating a light emitting device package of a third embodiment.

FIG. 8 is a plan view illustrating a light emitting device package of a fourth embodiment.

FIG. 9 is a perspective view illustrating a display device of an embodiment.

FIG. 10 is a plan view illustrating a display device of an embodiment.

FIG. 11 is a plan view illustrating a lower electrode of a light emitting device package and a solder pad of a driving substrate of an embodiment.

MODES OF THE INVENTION

Embodiments may be modified to different forms or various embodiments may be combined with each other, and the scope of the present invention is not limited to each embodiment to be described below.

Even though a matter described in a specific embodiment is not described in another embodiment, it may be understood as a related description of another embodiment unless it is opposed or conflicting with the matter in another embodiment.

For example, when features of configuration A are described in a specific embodiment and features of configuration B are described in another embodiment, it should be understood that even though an embodiment in which configuration A and configuration B are combined is not explicitly described, the embodiment falls within the scope of the present invention as long as there is no opposed or conflicting explanations.

Hereinafter, the embodiments of the present invention capable of specifically realizing the objectives will be described with reference to the accompanying drawings.

In the description of embodiments according to the present invention, when it is stated as being formed "on" or "under" of each element, the term "on" or "under" includes both meanings that two elements are in direct contact with each other (directly) and one or more other elements are interposed between the above two elements (indirectly). Also, when it is represented as "on or under", it may include a meaning of a downward direction as well as an upper direction with reference to one element.

A semiconductor device may include various electronic devices such as a light emitting device and a light receiving device, and the light emitting device and the light receiving device both may include a first conductive type semiconductor layer, an active layer, and a second conductive type semiconductor layer.

A semiconductor device according to the embodiment may be a light emitting device.

A light emitting device emits light by the recombination of electrons and holes, and wavelengths of the light are determined by unique energy band gaps of materials. Therefore, the emitted light may vary according to the composition of the materials.

FIG. 1 is a perspective view illustrating a light emitting device package according to a first embodiment, FIG. 2 is a plan view illustrating a substrate and a plurality of light emitting devices according to the first embodiment, FIG. 3 is a sectional view illustrating a light emitting device package taken along a line I-I' of FIG. 2, and FIG. 4 is a plan view illustrating a lower surface of the substrate according to the first embodiment.

As shown in FIGS. 1 to 4, a light emitting device package 100 according to the first embodiment may display full color and may correspond to one pixel of a display device. For this purpose, the light emitting device package 100 may include a substrate 120, first to third light emitting devices 151, 152, and 153, and a molding part 170.

The substrate 120 may be a polygonal structure. For example, the substrate 120 may include four corners and four outer side surfaces, and have a plate shape having flat upper and lower surfaces, but is not limited thereto. The substrate 120 according to the first embodiment may include first to fourth corners 125, 126, 127, and 128 and first to fourth outer side surfaces 121, 122, 123, and 124.

The first outer side surface 121 may be symmetrical in parallel with the second outer side surface 122. The third outer side surface 123 may be symmetrical in parallel with the fourth outer side surface 124. The first and second outer side surfaces 121 and 122 may be disposed in a direction orthogonal from the third and fourth outer side surfaces 123 and 124.

A top-view of the substrate 120 may be a square structure, but is not limited thereto. The top-view of the substrate 120 may correspond to a pixel structure of the display device. For example, the top-view of the substrate 120 may vary in various shapes such as a rectangle, polygon, ellipse, circle, etc. The substrate 120 may be 0.6 mm×0.6 mm based on a pixel of 0.8 mm×0.8 mm. Here, pixels may include a black matrix with a width of 0.1 mm along an edge. That is, widths of the first to fourth outer side surfaces 121, 122, 123, and 124 in the substrate 120 may be equal to each other, which is 0.6 mm.

The first corner 125 may be disposed in the area in which the first outer side surface 121 and the third outer side surface 123 meet. The second corner 126 may be disposed in the area in which the second outer side surface 122 and the third outer side surface 123 meet. The third corner 127 may be disposed in the area in which the first outer side surface 121 and the fourth outer side surface 124 meet. The fourth corner 128 may be disposed in the area in which the second outer side surface 122 and the fourth outer side surface 124 meet.

The substrate 120 may include a resin-based printed circuit board (PCB), a metal core PCB, a flexible PCB, a ceramic PCB, or an FR-4 substrate. The substrate 120 according to the first embodiment may include a PCB having a metal layer. The substrate 120 may include an insulator 120S, upper electrode patterns 131, 132, 133, and 134, lower electrode patterns 141, 142, 143, and 144, and first to third connecting electrodes 161, 162, and 163.

The upper electrode patterns 131, 132, 133, and 134 may be disposed on the insulator 120S. The lower electrode patterns 141, 142, 143, and 144 may be disposed under the insulator 120S. The upper electrode patterns 131, 132, 133, and 134 and the lower electrode patterns 141, 142, 143, and 144 may be formed of at least one of titanium (Ti), copper (Cu), nickel (Ni), gold (Au), chromium (Cr), tantalum (Ta), platinum (Pt), tin (Sn), and phosphorus (P), or optional alloys thereof, and may be formed in a single layer or multiple layers. The upper electrode patterns 131, 132, 133, and 134 may include a first upper electrode 131, a second upper electrode 132, a third upper electrode 133 and a fourth upper electrode 134. The lower electrode patterns 141, 142, 143, and 144 may include a first lower electrode 141, a second lower electrode 142, a third lower electrode 143, and a fourth lower electrode 144.

The first upper electrode 131 may be extended from the first corner 125. The first upper electrode 131 may be spaced apart at a predetermined distance from the second and fourth upper electrodes 132 and 134. The first upper electrode 131 may be disposed in parallel with the second upper electrode 132 in a first direction X-X'. The first upper electrode 131 may be spaced apart at a predetermined distance from the second upper electrode 132 in the first direction X-X'. The first upper electrode 131 may be spaced apart from the second upper electrode 132 with a first distance D1. The first distance D1 may be 75 µm or more, but is not limited thereto.

The first upper electrode 131 may be disposed in parallel with the fourth upper electrode 134 in a second direction Y-Y'. The first upper electrode 131 may be spaced apart at a predetermined distance from the fourth upper electrode 134 in the second direction Y-Y'. The first upper electrode 131 may be spaced apart from the fourth upper electrode 134 with a fourth distance D4. The fourth distance D4 may be 75 µm or more, but is not limited thereto. Here, the first direction X-X' may be a direction orthogonal to the first and second outer side surfaces 121 and 122. The second direction Y-Y' may be a direction orthogonal to the first direction X-X' and may be a direction orthogonal to the third and fourth outer side surfaces 123 and 124.

The first upper electrode 131 may have a first width 131W in the second direction Y-Y'. The first width 131W may be 100 µm or more and may be 16% or more of a width of the first outer side surface 121. The first width 131W according to the first embodiment may be 150 µm or less and may be 25% or less of the width of the first outer side surface 121. The first width 131W may secure an area of a via hole connecting the first upper electrode 131 and the first lower electrode 141 and an area of mounting of the first light emitting device 151. The first upper electrode 131 according to the first embodiment with the first width 131W may improve the physical and electrical reliability between the first upper electrode 131 and the first lower electrode 141 of the substrate 120. The first upper electrode 131 according to the first embodiment with the first width 131W may improve the physical and electrical reliability between the first light emitting device 151 and the substrate 120.

The second upper electrode 132 may be extended from the second corner 126. The second upper electrode 132 may be spaced apart at a predetermined distance from the first and fourth upper electrodes 131 and 134. The second upper electrode 132 may be disposed in parallel with the first upper electrode 131 in the first direction X-X'. The second upper electrode 132 may be spaced apart at a predetermined distance from the first upper electrode 131 in the first direction X-X'.

The second upper electrode 132 may include a second end 132a, and the second end 132a may face a first end 131a of the first upper electrode 131. A distance between the first and second ends 131a and 132a may correspond to the first distance D1.

The second upper electrode 132 may be disposed in parallel with the fourth upper electrode 134 in the second direction Y-Y'. The second upper electrode 132 may be spaced apart at a predetermined distance from the fourth upper electrode 134 in the second direction Y-Y'. The second upper electrode 132 may be spaced apart from the fourth upper electrode 134 with a second distance D2. The second distance D2 may be 75 µm or more, but is not limited thereto.

The second upper electrode 132 may have a second width 132W in the second direction Y-Y'. The second width 132W may be 100 µm or more and may be 16% or more of a width of the second outer side surface 122. The second width 132W according to the first embodiment may be 150 µm or less and may be 25% or less of the width of the second outer side surface 122. The second width 132W may secure an area of a via hole connecting the second upper electrode 132 and the second lower electrode 142 and an area of mounting of the second light emitting device 152. The second upper electrode 132 of the first embodiment with the second width 132W may improve the physical and electrical reliability between the second upper electrode 132 and the second lower electrode 142 of the substrate 120. The second upper electrode 132 of the first embodiment with the second width 132W may improve the physical and electrical reliability between the second light emitting device 152 and the substrate 120.

The second upper electrode 132 may include a first side 132b. The first side 132b may be disposed in an inner side direction from the third outer side surface 123 of the substrate 120. The first side 132b may be adjacent to the second end 132a and adjacent to the third outer side surface 123, and may be disposed to face the third outer side surface 123.

The first embodiment may have a fifth distance D5 between the first side 132b and the third outer side surface 123. The fifth distance D5 may be 5 µm or more, but is not limited thereto. The fifth distance D5 may improve a bonding force between the molding part 170 and the substrate 120 by securing a wide contact area between the molding part 170 and the second upper electrode 132 of the substrate 120 and the insulator 120S. The fifth distance D5 of the first embodiment may be 10 µm. For example, the fifth distance D5 may be 3% or more of the second width 132W.

A fourth width W4 of the first side 132b may be larger than a fifth width W5 of the second upper electrode 132 exposed along the third outer side surface 123 from the second corner 126. For example, a sum of the fourth and fifth widths W4 and W5 may be 260 µm or less, and the fourth width W4 may be 130 µm or more. The fourth width W4 may be 50% or more of the sum of the fourth and fifth widths W4 and W5. In the first embodiment, since the fourth width W4 is designed to be larger than the fifth width W5, the bonding force between the molding part 170 and the substrate 120 may be further improved.

The third upper electrode 133 may be extended from the third corner 127. The third upper electrode 133 may be spaced apart at a predetermined distance from the fourth upper electrode 134. The second upper electrode 133 may be spaced apart from the fourth upper electrode 134 with a third distance D3. The third distance D3 may be 75 μm or more, but is not limited thereto.

The third upper electrode 133 may be disposed in parallel with the fourth upper electrode 134 in the first and second directions X-X' and Y-Y'. The third upper electrode 133 may include a third end 133a, and the third end 133a may face the fourth upper electrode 134.

The third upper electrode 133 may have a third width 133W in the second direction Y-Y'. The third width 133W may be 100 μm or more and may be 16% or more of the width of the first outer side surface 121. The third width 133W of the first embodiment may be 150 μm or less and may be 25% or less of the width of the first outer side surface 121. The third width 133W may secure an area of a via hole connecting the third upper electrode 133 and the third lower electrode 143 and an area of mounting of the third light emitting device 153. The third upper electrode 133 of the first embodiment with the third width 133W may improve the physical and electrical reliability between the third upper electrode 133 and the third lower electrode 143 of the substrate 120. The third upper electrode 133 of the first embodiment with the third width 133W may improve the physical and electrical reliability between the third light emitting device 153 and the substrate 120.

The third upper electrode 133 may include a second side 133b. The second side 133b may be disposed in an inner side direction from the fourth outer side surface 124 of the substrate 120. The second side 133b may be adjacent to the third end 133a and adjacent to the fourth outer side surface 124, and may be disposed to face the fourth outer side surface 124.

The first embodiment may have a sixth distance D6 between the second side 133b and the fourth outer side surface 124. The sixth distance D6 may be 5 μm or more, but is not limited thereto. The sixth distance D6 may improve the bonding force between the molding part 170 and the substrate 120 by securing a wide contact area between the molding part 170 and the third upper electrode 133 of the substrate 120 and the insulator 120S. The sixth distance D6 of the first embodiment may be 10 μm. For example, the sixth distance D6 may be 3% or more of the third width 133W.

A sixth width W6 of the second side 133b may be larger than a seventh width W7 of the third upper electrode 133 exposed along the fourth outer side surface 124 from the third corner 127. For example, a sum of the sixth and seventh widths W6 and W7 may be 430 μm or less and the sixth width W6 may be 215 μm or more. The sixth width W6 may be 50% or more of the sum of the sixth and seventh widths W6 and W7. In the first embodiment, since the sixth width W6 is designed to be larger than the seventh width W7, the bonding force between the molding part 170 and the substrate 120 may be further improved.

The fourth upper electrode 134 may be extended from the fourth corner 128. The fourth upper electrode 134 may be spaced apart at a predetermined distance from the first to third upper electrodes 131, 132, 133. The fourth upper electrode 134 may be extended to be adjacent to the first outer side surface 121 from the fourth corner 128. The fourth upper electrode 134 may be orthogonal to a central axis C which passes a center of the substrate 120 in the second direction Y-Y'. The fourth upper electrode 134 may be extended in the second direction Y-Y' from the fourth corner 128 and may have a shape bent in the first direction X-X' orthogonal to the central axis C of the substrate 120. The fourth upper electrode 134 may be disposed between the first upper electrode 131 and the third upper electrode 133. The fourth upper electrode 134 may be disposed between the second upper electrode 132 and the third upper electrode 133.

The fourth upper electrode 134 may include a function of common electrode. For example, the fourth upper electrode 134 may be connected to anodes of the first to third light emitting devices 151, 152, and 153 and each of the first to third upper electrodes 131, 132, 133 may be connected to each cathode of the first to third light emitting devices 151, 152, and 153.

The fourth upper electrode 134 may have a fourth width 134W in the second direction Y-Y'. The fourth width 134W may be 100 μm or more and may be 16% or more of the width of the first outer side surface 121. The fourth width 134W of the first embodiment may be 150 μm or less and may be 25% of the width of the first outer side surface 121. The fourth width 134W may secure an area of a via hole connecting the fourth upper electrode 134 and the fourth lower electrode 144 and the area of mounting of the third light emitting device 153. The fourth upper electrode 134 of the first embodiment with the fourth width 134W may improve the physical and electrical reliability between the fourth upper electrode 134 and the fourth lower electrode 144 of the substrate 120. The fourth upper electrode 134 of the first embodiment with the fourth width 134W may improve the physical and electrical reliability between the third light emitting device 153 and the substrate 120.

The fourth upper electrode 134 may include a third side 134b. The third side 134b may be disposed in an inner side direction from the second outer side surface 122 of the substrate 120. The third side 134b may be spaced apart at a predetermined distance from the fourth corner 128, may be adjacent to the second outer side surface 122, and may be disposed to face the second outer side surface 122. The first embodiment may have a seventh distance D7 between the third side 134b and the second outer side surface 122. The fourth upper electrode 134 may include a fourth end 134a, and the fourth end 134a may face the first outer side surface 121.

The first embodiment may have an eighth distance D8 between the fourth end 134a and the first outer side surface 121. The seventh and eighth distances D7 and D8 may be 5 μm or more, but is not limited thereto. The seventh and eighth distances D7 and D8 may improve the bonding force between the molding part 170 and the substrate 120 by securing a wide contact area between the molding part 170 and the fourth upper electrode 134 and the insulator 120S of the substrate 120. The seventh and eighth distances D7 and D8 of the first embodiment may be 10 μm. For example, the seventh and eighth distances D7 and D8 may be 3% or more of the fourth width 134W.

An eighth width W8 of the third side 134b may be larger than a ninth width W9 of the fourth upper electrode 134 exposed along the second outer side surface 122 from the fourth corner 128. For example, a sum of the eighth and ninth widths W8 and W9 may be 375 μm or less and the eighth width W8 may be 188 μm or more. The eighth width W8 may be 50% or more of the sum of the eighth and ninth widths W8 and W9. In the first embodiment, since the eighth width W8 is designed to be larger than the ninth width W9, the bonding force between the molding part 170 and the substrate 120 may be further improved.

The first to fourth widths 131W, 132W, 133W, and 134W of the first embodiment may be the same, but is not limited thereto. For example, each of the first to fourth widths 131W, 132W, 133W, and 134W may be within a range of ±10% of an average of the first to fourth widths 131W, 132W, 133W, and 134W.

The lower electrode patterns 141, 142, 143, and 144 may include the first lower electrode 141, the second lower electrode 142, the third lower electrode 143, and the fourth lower electrode 144. The first to fourth lower electrodes 141, 142, 143, and 144 may have the same area, but are not limited thereto. For example, the first to fourth lower electrodes 141, 142, 143, and 144 may have a width of 200 μm. The width of each of the first to fourth lower electrodes 141, 142, 143, and 144 may be within a range of ±10% of an average of the first to fourth lower electrodes 141, 142, 143, and 144.

The first lower electrode 141 may be extended from the first corner 125. A top view of the first lower electrode 141 may have a square structure having four sides, but is not limited thereto. At least two sides of the first lower electrode 141 may be exposed from a side surface of the substrate 120. The first lower electrode 141 may be disposed in parallel with the second lower electrode 142 in the first direction X-X'. The first lower electrode 141 may be spaced apart at a predetermined distance from the second lower electrode 142 in the first direction X-X'. For example, a distance between the first and second lower electrodes 141 and 142 may correspond to a width of the first lower electrode 141, but is not limited thereto. For example, the distance between the first and second lower electrodes 141 and 142 may be smaller than each width of the first and second lower electrodes 141 and 142.

The first lower electrode 141 may be disposed in parallel with the third lower electrode 143 in the second direction Y-Y'. The first lower electrode 141 may be spaced apart at a predetermined distance from the third lower electrode 143 in the second direction Y-Y'. For example, a distance between the first and third lower electrodes 141 and 143 may correspond to the width of the first lower electrode 141. For example, the distance between the first and third lower electrodes 141 and 143 may be smaller than each width of the first and third lower electrodes 141 and 143. The distance between the first and third lower electrodes 141 and 143 may be 200 μm.

The second lower electrode 142 may be extended from the second corner 126. A top view of the second lower electrode 142 may have a square structure having four sides, but is not limited thereto. At least two sides of the second lower electrode 142 may be exposed from the side surface of the substrate 120.

The second lower electrode 142 may be disposed in parallel with the first lower electrode 141 in the first direction X-X'. The second lower electrode 142 may be spaced apart at a predetermined distance from the first lower electrode 141 in the first direction X-X'.

The second lower electrode 142 may be disposed in parallel with the fourth lower electrode 144 in the second direction Y-Y'. The second lower electrode 142 may be spaced apart at a predetermined distance from the fourth lower electrode 144 in the second direction Y-Y'. For example, a distance between the second and fourth lower electrodes 142 and 144 may correspond to a width of the second lower electrode 142. The distance between the second and fourth lower electrodes 142 and 144 may be 200 μm. For example, the distance between the second and fourth lower electrodes 142 and 144 may be smaller than each width of the second and fourth lower electrodes 142 and 144.

The third lower electrode 143 may be extended from the third corner 127. A top view of the third lower electrode 143 may have a square structure having four sides, but is not limited thereto. At least two sides of the third lower electrode 143 may be exposed from the side surface of the substrate 120.

The third lower electrode 143 may be disposed in parallel with the fourth lower electrode 144 in the first direction X-X'. The third lower electrode 143 may be spaced apart at a predetermined distance from the fourth lower electrode 144 in the first direction X-X'.

The third lower electrode 143 may be disposed in parallel with the first lower electrode 141 in the second direction Y-Y'. The third lower electrode 143 may be spaced apart at a predetermined distance from the first lower electrode 141 in the second direction Y-Y'. For example, a distance between the third and first lower electrodes 143 and 141 may correspond to a width of the third lower electrode 143. The distance between the third and first lower electrodes 143 and 141 may be 200 μm. For example, the distance between the third and first lower electrodes 143 and 141 may be smaller than each width of the third and first lower electrodes 143 and 141.

The fourth lower electrode 144 may be extended from the fourth corner 128. A top view of the fourth lower electrode 144 may have a square structure having four sides, but is not limited thereto. At least two sides of the fourth lower electrode 144 may be exposed from the side surface of the substrate 120. The fourth lower electrode 144 may be disposed in parallel with the third lower electrode 143 in the first direction X-X'. The fourth lower electrode 144 may be spaced apart at a predetermined distance from the third lower electrode 143 in the first direction X-X'.

The fourth lower electrode 144 may be disposed in parallel with the second lower electrode 142 in the second direction Y-Y'. The fourth lower electrode 144 may be spaced apart at a predetermined distance from the second lower electrode 142 in the second direction Y-Y'. For example, a distance between the fourth and second lower electrodes 144 and 142 may correspond to a width of the fourth lower electrode 144. The distance between the fourth and second lower electrodes 144 and 142 may be 200 μm. For example, the distance between the fourth and second lower electrodes 144 and 142 may be smaller than each width of the fourth and second lower electrodes 144 and 142.

The first connecting electrode 161 is formed in a via hole passing through the insulator 120S, and may connect between the first upper electrode 131 and the first lower electrode 141. The second connecting electrode 162 is formed in the via hole passing through the insulator 120S, and may connect between the second upper electrode 132 and the second lower electrode 142. The third connecting electrode 163 is formed in the via hole passing through the insulator 120S, and may connect between the third upper electrode 133 and the third lower electrode 143. The first to third connecting electrodes 161, 162, and 163 may have first to third sectional widths W1, W2, and W3, respectively. The first to third sectional widths W1, W2, and W3 may be smaller than the first to third widths 131W, 132W, and 133W. For example, the first to third sectional widths W1, W2, and W3 may be less than 100 µm. Although not shown in the drawing, the first embodiment may include a fourth connecting electrode (not shown) connecting between the fourth upper electrode 134 and the fourth lower electrode 144.

The first to third light emitting devices 151, 152, and 153 may emit color different from each other. For example, the first light emitting device 151 may emit light of a red wavelength, and the second light emitting device 152 may emit light of a green wavelength, and the third light emitting device 153 may emit light of a blue wavelength. The first light emitting device 151 may have a different operating voltage from those of the second and third light emitting devices 152, 153 due to a difference in physical property. The first light emitting device 151 of the first embodiment may be disposed on a diagonal to the fourth corner 128 adjacent to the fourth upper electrode 134. For example, the first light emitting device 151 may be disposed in the first corner 125 on the diagonal from the fourth corner 128 adjacent to the fourth upper electrode 134 having a common electrode function. The first light emitting device 151 may be disposed in the first corner 125 on the diagonal from the fourth corner 128 adjacent to the fourth upper electrode 134, thereby improving convenience in a mounting process.

As another example, the first to third light emitting devices 151, 152, and 153 may include a UV light emitting layer and a fluorescent layer. The first to third light emitting devices 151, 152, and 153 may include a sapphire substrate 51, a light emitting layer 53, and first and second light emitting device electrodes 57 and 59. The first and second light emitting device electrodes 57 are 59 are disposed at lower portions of the first to third light emitting devices 151, 152, and 153, which may be a flip chip structure mounted directly on the substrate 120.

The light emitting device package 100 of the first embodiment may implement full color by mixing light emitted from the first to third light emitting devices 151, 152, and 153. The first to third light emitting devices 151, 152, and 153 may have a same height, but are not limited thereto. For example, each of the first to third light emitting devices 151, 152, and 153 may be within a range of ±10% of an average of the first to third light emitting devices 151, 152, and 153.

The first to third light emitting devices 151, 152, and 153 may have a same height, and the sapphire substrate 51 of the first to third light emitting devices 151, 152, and 153 may be 100 µm or more. The first embodiment may improve mixing of light and implement volume light emission by the sapphire substrate 51 of 100 µm or more and the first to third light emitting devices 151, 152, and 153 with the same height.

The first to third light emitting devices 151, 152, and 153 may be disposed with a predetermined distance. The first light emitting device 151 may be disposed to be adjacent to the first corner 125, and the second light emitting device 152 may be disposed to be adjacent to the second corner 126. The third light emitting device 153 may be disposed between the first and second light emitting devices 151 and 152 and may be disposed on the central axis C. The third light emitting device 153 may be disposed to be adjacent to the fourth outer side surface 124.

The first to third light emitting devices 151, 152, and 153 may be disposed with a distance of 50 µm or more. For example, a distance among the first to third light emitting devices 151, 152, and 153 may be 30% or more of each minor width of the first to third light emitting devices 151, 152, and 153. Here, each of the first to third light emitting devices 151, 152, and 153 may have major and minor widths of 250 µm×150 µm based on the substrate 120 of 0.6 mm×0.6 mm. A damage due to friction of the first to third light emitting devices 151, 152, and 153 in a mounting process may be improved by disposing the first to third light emitting devices 151, 152, and 153 with the distance of 50 µm or more. A light loss due the interference of each light of the first to third light emitting devices 151, 152, and 153 may be improved by disposing the first to third light emitting devices 151, 152, and 153 with the distance of 50 µm or more.

The third light emitting device 153 may be overlapped with the first and second light emitting devices 151 and 152. For example, the third light emitting device 153 may have a first overlapping area O1 overlapped with the first light emitting device 151 in the second direction Y-Y'. The third light emitting device 153 may have a second overlapping area O2 overlapped with the second light emitting device 152 in the second direction Y-Y'. A light loss due the interference of each light of the first to third light emitting devices 151, 152, and 153 may be improved by minimizing the overlapping areas of the first to third light emitting devices 151, 152, and 153. The first and second overlapping areas O1 and O2 may be half or less of each width of the first to third light emitting devices 151, 152, and 153 in the second direction Y-Y'. The first and second overlapping areas O1 and O2 may be ⅓ or less of each width of the first to third light emitting devices 151, 152, and 153 in the second direction Y-Y'. The first and second overlapping areas O1 and O2 may be ½ or less of each width of the first to third light emitting devices 151, 152, and 153 in the second direction Y-Y', and may be ¼ or less preferably. The first and second overlapping areas O1 and O2 may be 135 µm to 35 µm based on the first to third light emitting devices 151, 152, and 153 with a width of 270 µm in the second direction Y-Y'.

Although the first embodiment describes in a limited manner the structure having the first and second overlapping areas O1 and O2 overlapped with the first and second light emitting devices 151 and 152, but is not limited thereto. For example, the first to third light emitting devices 151, 152, and 153 may not have an overlapped area from each other.

In the first embodiment, the first to third light emitting devices 151, 152, and 153 may be disposed within a predetermined curvature range from the center of the substrate 120. The radius of curvature of the embodiment may be 250 µm. The radius of curvature of a region including first to third central portions 151c, 152c, and 153c of the first to third light emitting devices 151, 152, and 153 from a center of the light emitting device package 100 may be determined by a pixel and may be 50% or less of a pixel size and may be 31% of the pixel size in the first embodiment. Specifically, the central portion of the first light emitting device 151, the central portion of the second light emitting device 152, and the central portion of the third light emitting device 153 may be disposed within a curvature range having a curvature radius of 250 µm. When the central portions of the first to third light emitting devices 151, 152, and 153 are out of the curvature range, the volume light emission may be lowered by light mixing and uneven brightness.

The molding part 170 may be disposed on the substrate 120. A top view of the molding part 170 may correspond to a top view shape of the substrate 120. For example, the molding part 170 and the substrate 120 may be entirely overlapped with each other. The molding part 170 may include a black filler 171. The black filler 171 may improve appearance quality by implementing black color when the light emitting device package 100 does not emit light. For example, when the light emitting device package 100 is included in a display device, the black filler 171 may improve appearance quality by implementing a screen of black color when the display device stops driving.

The molding part 170 may have a thickness which may protect the first to third light emitting devices 151, 152, and 153 and improve the light loss from the first to third light emitting devices 151, 152, and 153. For example, a second height H2 between an upper surface of the molding part 170 and upper surfaces of the first to third light emitting devices 151, 152, and 153 may be equal to or lower than a first height H1 of the sapphire substrate 51 of each of the first to third light emitting devices 151, 152, and 153. For example, the first height H1 may be 100 μm and the second height H2 may be 100 μm or less. The second height H2 may be 50 μm or less. The second height H2 may be 100% or less of the sapphire substrate 51, or 50% or less of the sapphire substrate 51 as smaller. The first embodiment may improve the mixing and linearity of light by including the molding part 170 of the second height H2 having a height which is equal to or lower than the first height H1. Here, the first height H1 of the sapphire substrate 51 with 100 μm may be the height for volume light emission from each of the first to third light emitting devices 151, 152, and 153, but is not limited thereto. For example, the first height H1 may be 100 μm or less.

The molding part 170 may include a predetermined ninth distance D9 between the first to third light emitting devices 151, 152, and 153 and an adjacent side surface. The ninth distance D9 may be a distance between the first to third light emitting devices 151, 152, and 153 and a side surface of the molding part 170 closest thereto. The ninth distance D9 may be 25 μm or more. For example, the ninth distance D9 may be 16% or more of the minor width of the first to third light emitting devices 151, 152, and 153. Here, each of the first to third light emitting devices 151, 152, and 153 may have major and minor widths of 250 μm×150 μm based on the substrate 120 of 0.6 mm×0.6 mm. The ninth distance D9 may protect a damage of the first to third light emitting devices 151, 152, and 153 during a sawing process which separates into unit light emitting device packages 100 after forming the molding part 170.

In the first embodiment, the first to third light emitting devices 151, 152, and 153 may be disposed on the substrate 120, and the first to third light emitting devices 151, 152, and 153 may be individually connected to the first to third upper electrodes 131, 132, and 133, and commonly connected to the fourth upper electrode 134 to be driven individually. The first embodiment may provide full color by individual driving of the first to third light emitting devices 151, 152, and 153 of a flip chip type.

In the first embodiment, the first to third light emitting devices 151, 152, and 153 having the same height may include the sapphire substrate 51 of 100 μm or less, and slimness of the light emitting device package 100 and volume light emission may be simultaneously implemented by a thickness of the molding part 170 on the first to third light emitting devices 151, 152, and 153 having a lower height than that of the sapphire substrate 51. In addition, the first embodiment may implement uniform color and uniform brightness by the above-described structure.

In the first embodiment, the bonding force between the molding part 170 and the substrate 120 may be improved by the structure having the fifth to eighth distances D5, D6, D7, and D8 spaced apart between the first to fourth upper electrodes 131, 132, 133, and 134 and the first to fourth outer side surfaces 121, 122, 123, and 124 of the substrate 120, thereby improving reliability.

FIG. 5 is a plan view illustrating a base substrate manufacturing a unit substrate of the first embodiment.

As shown in FIG. 5, the first embodiment may include an upper electrode pattern 130 that shares between adjacent unit light emitting device packages 120*a* to 120*d* on a base substrate 20.

The upper electrode pattern 130 may include a third upper electrode 133 of a first light emitting device package 120*a*, a fourth upper electrode 134 of a second light emitting device package 120*b*, a first upper electrode 131 of a third light emitting device package 120*c*, and a second upper electrode 132 of a fourth light emitting device package 120*d*. Although not shown in the drawing, the base substrate 20 may include on a lower surface thereof a lower electrode pattern (not shown) including first to fourth lower electrodes of the unit light emitting device packages 120*a* to 120*d*.

In the first embodiment, the light emitting devices are mounted on the base substrate 20, and the molding part is formed, and then the unit light emitting device packages 120*a* to 120*d* are separated respectively through a sawing process to complete the manufacturing process of the light emitting device package.

FIG. 6 is a plan view illustrating a light emitting device package according to a second embodiment.

As shown in FIG. 6, the second embodiment may include a substrate 220 and first to third light emitting devices 151, 152, and 153. The second embodiment may include a first upper electrode 231.

The first to third light emitting devices 151, 152, and 153 may adopt technical features of the first embodiment with reference to FIGS. 1 to 5. The second to fourth upper electrodes 132, 133, and 134 may adopt the technical features of the first embodiment. Although not shown in the drawing, the second embodiment may include a molding part, and the molding part may adopt the technical features of the first embodiment.

The first upper electrode 231 may be extended from the first corner 125. The first upper electrode 231 may be spaced apart at a predetermined distance from the second and fourth upper electrodes 132 and 134. The first upper electrode 231 may be disposed in parallel with the second upper electrode 132 in a first direction X-X'. The first upper electrode 231 may be spaced apart at a predetermined distance from the second upper electrode 132 in the first direction X-X'.

The first upper electrode 231 may include a first end 231*a*, and the first end 231*a* may face a second end 132*a* of the second upper electrode 132. A distance between the first and second ends 231*a* and 132*a* may be 75 μm or more, but is not limited thereto.

The first upper electrode 231 may be disposed in parallel with the fourth upper electrode 134 in a second direction Y-Y'. The first upper electrode 231 may be spaced apart at a predetermined distance from the fourth upper electrode 134 in the second direction Y-Y'. The first upper electrode 231 may have a width of 100 μm or more in the second direction Y-Y'. The width of the first upper electrode 231 may adopt the technical features of the first embodiment.

The first upper electrode 231 may include a fourth side 231*b*. The fourth side 231*b* may be disposed from a third outer side surface 123 of the substrate 120 in an inner side direction. The fourth side 231*b* may be adjacent to the first end 231*a* and adjacent to the third outer side surface 123, and may be disposed to face the third outer side surface 123.

The second embodiment may have a tenth distance D10 between the fourth side 231b and the third outer side surface 123. The tenth distance D10 may be 5 μm or more, but is not limited thereto. The tenth distance D10 may improve a bonding force between the molding part and the substrate 220 by securing a wide contact area between the molding part and the first upper electrode 231 and an insulator of the substrate 220. The tenth distance D10 according to the second embodiment may be 10 μm based on the substrate 220 of 0.6 mm×0.6 mm.

In the second embodiment, the first to third light emitting devices 151, 152, and 153 may be disposed on the substrate 220, and the first to third light emitting devices 151, 152, and 153 may be individually connected to the first to third upper electrodes 231, 132, and 133, and commonly connected to the fourth upper electrode 134, and may be driven individually. The second embodiment may provide full color by individual driving of the first to third light emitting devices 151, 152, and 153 of a flip chip type.

In the second embodiment, the first to third light emitting devices 151, 152, and 153 having a predetermined height may include a sapphire substrate of 100 μm or less, and slimness of a light emitting device package and volume light emission may be simultaneously implemented by a thickness of the molding part on the first to third light emitting devices 151, 152, and 153 having a lower height than that of the sapphire substrate. In addition, the second embodiment may implement uniform color and uniform brightness by the above-described structure.

In the second embodiment, the bonding force between the molding part and the substrate 220 may be improved by the structure having fifth to eighth distances D5, D6, D7, and D8 and the tenth distance D10 spaced apart between the first to fourth upper electrodes 231, 132, 133, and 134 and first to fourth outer side surfaces 121, 122, 123, and 124 of the substrate 220, thereby improving reliability.

FIG. 7 is a plan view illustrating a light emitting device package according to a third embodiment.

As shown in FIG. 7, the third embodiment may include a substrate 320 and first to third light emitting devices 151, 152, and 353.

The first and second light emitting devices 151 and 152 may adopt the technical features of the first embodiment, referring to FIG. 1 to FIG. 5. The substrate 320 may adopt the technical features of the first embodiment. Although not shown in the drawing, the third embodiment may include a molding part, and the molding part may adopt the technical features of the first embodiment.

The third light emitting device 353 may be mounted on the third and fourth upper electrodes 133 and 134. The third light emitting device 353 may be disposed adjacent to a fourth corner 128. The third light emitting device 353 may be disposed on the third and fourth upper electrodes 133 and 134 spaced apart in a first direction X-X'. Here, the first light emitting device 151 may be disposed on the first and fourth upper electrodes 131 and 134 spaced apart in a second direction Y-Y', and the second light emitting device 152 may be disposed on the second and fourth upper electrodes 132 and 134 spaced apart in the second direction Y-Y'.

The third light emitting device 353 may be spaced apart at a predetermined distance from the first and second light emitting devices 151 and 152 in the second direction Y-Y'. According to the third embodiment, an arrangement structure of the third light emitting device 353 disposed on the third and fourth upper electrodes 133 and 134 spaced apart in the first direction X-X' does not overlap with the first and second light emitting devices 151 and 152 in the second direction Y-Y'. Therefore, in the third embodiment, light interference among the first to third light emitting devices 151, 152, and 353 may be improved by removing an overlapping area among the first to third light emitting devices 151, 152, and 353. According to the third embodiment, light efficiency may be improved by reducing the light loss due to light interference.

In the third embodiment, the first to third light emitting devices 151, 152, 353 may be disposed on the substrate 320, the first to third light emitting devices 151, 152, and 353 may be connected to the first to third upper electrodes 131, 132, and 133 individually, connected to the fourth upper electrode 134 commonly, and may be driven individually. According to the third embodiment, the first to third light emitting devices 151, 152, and 353 of a flip chip type may be individually driven to provide full color.

In the third embodiment, the first to third light emitting devices 151, 152, and 353 having the same height may include a sapphire substrate of 100 μm or less, and slimness of a light emitting device package and volume light emission may be simultaneously implemented by a thickness of the molding part on the first to third light emitting devices 151, 152, and 353 having a height lower than that of the sapphire substrate. Furthermore, according to the third embodiment, uniform color and uniform brightness may be implemented due to the above-described structure.

According to the third embodiment, a bonding force between the molding part and the substrate 320 may be improved due to the structure of the second to fourth upper electrodes 132, 133, and 134, thereby improving reliability.

FIG. 8 is a plan view illustrating a light emitting device package according to a fourth embodiment.

As shown in FIG. 8, the fourth embodiment may include a substrate 420 and first to third light emitting devices 451, 152, and 153.

The second and third light emitting devices 152 and 153 may adopt the technical features of the first embodiment, referring to FIG. 1 to FIG. 5. The substrate 420 may adopt the technical features of the first embodiment. Although not shown in the drawing, the third embodiment may include a molding part, and the molding part may adopt the technical features of the first embodiment.

The first light emitting device 451 may be mounted on a first upper electrode 431. The first light emitting device 451 may be a vertical type in which light emitting device electrodes are disposed at upper and lower sides. The first light emitting device 451 may be a red light emitting device. The red light emitting device may be provided as a vertical type which has excellent light extraction efficiency. The first light emitting device 451 may be a vertical type in order to improve light extraction efficiency and reliability. The first light emitting device 451 may further include a wire 451W connecting a light emitting device electrode (not shown) exposed on an upper portion to a fourth upper electrode 434.

Shape of the first and fourth upper electrodes 431 and 434 may be changed according to a structural feature of the vertical type first light emitting device 451. For example, the area of the first upper electrode 431 may be wider than the first embodiment, and the area of the fourth upper electrode 434 may be narrower than the first embodiment.

According to the fourth embodiment, light extraction efficiency and reliability may be improved by including the first light emitting device 451 of a vertical type red light emitting device.

According to the fourth embodiment, the first to third light emitting devices 451, 152, and 153 may be disposed on the substrate 420, and the first to third light emitting devices

451, 152, and 153 may be connected to the first to third upper electrodes 431, 132, and 133 individually, connected to the fourth upper electrode 434 commonly, and may be driven individually. According to the fourth embodiment, the second and third light emitting devices 152 and 153 of a flip chip type and the vertical type first light emitting device 451 may be individually driven to provide full color.

According to the fourth embodiment, a bonding force between the molding part and the substrate 420 may be improved due to the structure of the second to fourth upper electrodes 132, 133, and 434, thereby improving reliability.

FIG. 9 is a perspective view illustrating a display device according to an embodiment, FIG. 10 is a plan view illustrating a display device according to an embodiment, and FIG. 11 is a plan view illustrating a lower electrode of a light emitting device package and a solder pad in a driving substrate according to an embodiment.

As shown in FIGS. 9 to 11, a display device 1000 according to an embodiment may display an image or video but is not limited thereto, and may be applied to lighting units, backlight units, indicating devices, lamps, street lamps, vehicle lighting devices, vehicle display devices, smart watches, etc., but is not limited thereto.

The display device 1000 of the embodiment will be described with an example of a large display device over 100 inches.

The display device 1000 may include multiple light emitting device packages 100, a black matrix BM, and a driving substrate 1010.

The black matrix BM may include functions to prevent light leakage and to improve appearance quality. The black matrix BM may be an opaque organic material. For example, the black matrix BM may be a black resign. The black matrix BM may include an opening 1001 corresponding to one pixel. One opening 1001 may correspond to one pixel and may accommodate one light emitting device package 100. A thickness of the black matrix BM may be equal to a thickness of the light emitting device package 100. The black matrix BM may have a matrix structure which covers all outer side surfaces of the multiple light emitting device packages 100. The black matrix BM may improve appearance quality by blocking light interference between adjacent light emitting device packages 100 and providing a black color screen when the display device 1000 stops driving.

Each of the multiple light emitting device packages 100 may adopt the technical features of the light emitting device package in the first embodiment. In the light emitting device package 100, first to third light emitting devices 151, 152, 153 may be disposed in a constant curvature range R from a center P of a pixel corresponding to the opening 1001. According to an embodiment, a curvature radius may be 250 μm based on a pixel size of 0.8 mm×0.8 mm. The curvature radius of a region including first to third central portions 151C, 152C, and 153C of the first to third light emitting devices 151, 152, and 153 from a center of the light emitting device package 100 may be determined by a pixel, may be 50% or less of a pixel size, and may be 31% of a pixel size in the first embodiment. When the first to third central portions 151C, 152C, and 153C deviate from the curvature range R, volume light emission may be deteriorated due to light mixing and uneven brightness of the corresponding pixel.

The driving substrate 1010 may include a solder pad SP electrically connected with the multiple light emitting device packages 100. The solder pad SP may correspond one-to-one to first to fourth lower electrodes 141, 142, 143, and 144 of the light emitting device package 100. The solder pad SP may have a larger area than each area of the first to fourth lower electrodes 141, 142, 143, and 144. A central portion SC of the solder pad SP may be disposed in the first to fourth lower electrodes 141, 142, 143, and 144. Each of the first to fourth lower electrodes 141, 142, 143, and 144 may be completely overlapped with the solder pad SP. The solder pad SP may be 350 μm×350 μm based on the size of the light emitting device package 100 of 0.6 mm×0.6 mm, and the first to fourth lower electrodes 141, 142, 143, and 144 may be 200 μm×200 μm, respectively. An inner side IS1 of the solder pad SP may be overlapped with an inner side IS2 of each of the first to fourth lower electrodes 141, 142, 143, and 144 or may have an eleventh distance D11 spaced apart at a predetermined distance. The eleventh distance D11 may be 0 to 50 μm. The eleventh distance D11 may prevent a poor connection in a soldering process which mounts the light emitting device package 100 on the driving substrate 1010, and may improve the interference of adjacent electrodes. When the eleventh distance D11 exceeds 50 μm, it may cause a shortage with adjacent lower electrodes and the like. When a part of the first to fourth lower electrodes 141, 142, 143, and 144 is not overlapped with the solder pad SP, a poor connection may be caused.

Although not shown in the drawings, the display device 1000 of the embodiment may further include a heat-radiating member (not shown) disposed under the driving substrate 1010.

The display device 1000 of the embodiment may not only simplify a configuration of the display device but also implement slimness by including the light emitting device packages 100, black matrix BM, and driving substrate 1010, which may provide full color.

The embodiment implements videos and images by using the light emitting device packages 100, and thus has an advantage of excellent color purity and color reproduction.

The embodiment implements videos and images by using the light emitting device package 100 having excellent linearity, and thus a clear large display device over 100 inches may be implemented.

The embodiment may implement a large display device over 100 inches with high resolution with low cost.

According to an embodiment, the light emitting device packages 100 may be applied to not only the display device but also lighting units, indicating devices, lamps, street lamps, vehicle lighting devices, vehicle display devices, smart watches, etc., but is not limited thereto.

When used as a backlight unit of an image display device, the light emitting device package 100 may be used as an edge type backlight unit or a direct type backlight unit, when used as a light source of a lighting device, may be used as a light apparatus or bulb type, and may be used as a light source of a mobile device.

Semiconductor devices have a laser diode in addition to the above-described light emitting diode.

The laser diode, like the semiconductor devices, may include a first conductive type semiconductor layer, an active layer, and a second conductive type semiconductor layer of the above-described structure. And, the laser diode uses an electro-luminescence phenomenon that light is emitted when a current is flowing after bonding of a p-type first conductive type semiconductor and an n-type second conductive type semiconductor, but it has differences in direction and phase of emitted light. That is, the laser diode may emit light having one specific wavelength (monochromatic beam) in the same phase and same direction by using a stimulated emission phenomenon and a reinforcing interference phenomenon, and thus may be used for optical communication or medical equipment and semiconductor process equipment due to such characteristics.

Examples of a light receiving device may include a photodetector, a kind of transducer, which converts an intensity of detected light to an electrical signal. Such a photodetector may include a photocell (silicon, selenium), a photoconductive device (cadmium sulfide, cadmium selenide), a photodiode (PD) (for example, PD which has a peak wavelength in visible blind spectral region or true blind spectral region), a phototransistor, a photomultiplier, a phototube (vacuum, gas sealed), an infra-red (IR) detector, etc., but embodiments are not limited thereto.

In addition, a semiconductor device like a photodetector may be fabricated by using a direct band gap semiconductor which has excellent light conversion efficiency. Alternatively, there are various structures of photodetectors, and the most general structures of photodetectors include a pin type photodetector using p-n junction, a Schottky type photodetector using Schottky junction, and a metal semiconductor metal (MSM) type photodetector.

The photo diode, like the semiconductor devices, may include a first conductive type semiconductor layer, an active layer, and a second conductive type semiconductor layer of the above-described structure, and configured with p-n junction or pin structure. The photodiode is operated by applying a reverse bias or zero bias, and when light is incident on the photodiode, electrons and holes are generated and current flows. In this case, the size of a current is almost proportional to the intensity of light incident on the photodiode.

A photocell or solar cell is a kind of photodiodes, and may convert light to a current. The solar cell, like the semiconductor devices, may include a first conductive type semiconductor layer, an active layer, and a second conductive type semiconductor layer of the above-described structure.

In addition, it may be used as a rectifier of an electronic circuit through rectifying characteristics of a general diode by using p-n junction, and may be applied to an oscillation circuit or the like by applying to a very high frequency circuit.

In addition, the above-described semiconductor devices are not only implemented by semiconductor, and may further include a metal material in some cases. For example, the semiconductor device like a light receiving device may be implemented with at least one of Ag, Al, Au, In, Ga, N, Zn, Se, P, and As, and may be implemented with a semiconductor material doped with a p-type or n-type dopant, or an intrinsic semiconductor material.

Embodiments are mostly described above. However, they are only examples and do not limit the present invention. A person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the present invention defined in the following claims.

The invention claimed is:

1. A light emitting device package comprising:
a substrate:
a first light emitting device disposed on the substrate and emitting red wavelength;
a second light emitting device spaced from the first light emitting device in a first direction and emitting a blue or green wavelength;
a third light emitting device spaced from the first light emitting device and the second light emitting device in a second direction that is orthogonal to the first direction and emitting a green or blue wavelength; and
a molding part covering the first to third light emitting devices,
wherein the substrate includes a first upper electrode connected to the first light emitting device, a second upper electrode connected to the second light emitting device, a third upper electrode connected to the third light emitting device, and a fourth upper electrode commonly connected to the first to third light emitting devices by underlying each of the first to third light emitting devices,
wherein the first to third light emitting devices are disposed to be misaligned in the first direction,
wherein centers of the first to third light emitting devices are disposed within a circle having a radius of 250 μm from a center of the substrate;
wherein the substrate has a plurality of corners, wherein each corner is a point where two edges of the substrate meet each other,
wherein the first upper electrode is at a first corner of the substrate,
wherein the second upper electrode is at a second corner of the substrate,
wherein the third upper electrode is at a third corner of the substrate,
wherein the fourth upper electrode is at a fourth corner of the substrate,
wherein the first and second corners are spaced from each other in the first direction,
wherein the third and fourth corners are spaced from each other in the first direction,
wherein the first and third corners are spaced from each other in the second direction,
wherein the second and fourth corners are spaced from each other in the second direction,
wherein the first upper electrode is spaced from the second upper electrode in the first direction,
wherein the first upper electrode is spaced from the fourth upper electrode in the second direction,
wherein the second upper electrode is spaced from the fourth upper electrode in the second direction,
wherein the third upper electrode is spaced from the fourth upper electrode in the first and second directions, and
wherein the third light emitting device has an overlapping area overlapped with at least one of the first and second light emitting devices in the second direction, and the overlapping area is not more than half of a width of the third light emitting device in the second direction.

2. The light emitting device package of claim 1, wherein:
the first to third light emitting devices are a flip chip type having the same height;
each of the first to third light emitting devices includes a sapphire substrate, and a height between a top surface of the molding part and a top surface of the sapphire substrate is less than a height between a bottom surface and the top surface of the sapphire substrate; and
the first to third light emitting devices are disposed with a distance of 50 μm or more from each other.

3. The light emitting device package of claim 1,
wherein a first distance between the first and second upper electrodes in the first direction is 75 μm or more, wherein a second distance between the second and fourth upper electrodes in the second direction is 75 µm or more, wherein a third distance between the third and fourth upper electrodes in the second direction is 75 µm or more, wherein a fourth distance between the first and fourth upper electrodes in the second direction is 75 µm or more, wherein the first to fourth upper electrodes have a width of 100 µm or more in the second direction, wherein the first to fourth upper electrodes include a side portion spaced apart from an outer side surface of the substrate, and wherein a distance between the side portion and the outer side surface of the substrate is 5 µm or more.

4. The light emitting device package of claim 1, wherein the third light emitting device is adjacent to the third corner, and is disposed on the third and fourth upper electrodes spaced apart in the first direction, and is spaced apart at a predetermined distance from the first and second light emitting devices in the second direction.

5. The light emitting device package of claim 1, wherein the first to fourth upper electrode are disposed on a top surface of the substrate and a lower electrode is disposed on a bottom surface of the substrate, wherein the lower electrode includes:

a first lower electrode extended from a first corner of the substrate;

a second lower electrode extended from a second corner of the substrate and spaced apart from the first lower electrode in the first direction;

a third lower electrode extended from a third corner of the substrate and spaced apart from the first lower electrode in the second direction; and a fourth lower electrode extended from a fourth corner of the substrate and spaced apart from the third lower electrode in the first direction.

6. The light emitting device package of claim 5, wherein the first to fourth lower electrodes have a same area.

7. The light emitting device package of claim 5, comprising:

a first connecting electrode connecting between the first upper electrode and the first lower electrode;

a second connecting electrode connecting between the second upper electrode and the second lower electrode; and a third connecting electrode connecting between the third upper electrode and the third lower electrode, wherein the first to third connecting electrodes are disposed in a via hole passing through the substrate.

8. The light emitting device package of claim 1, wherein the first to third light emitting devices have a same height.

9. The light emitting device package of claim 1, wherein the first light emitting device is a vertical type.

10. The light emitting device package of claim 1, wherein the molding part includes a black filler.

11. The light emitting device package of claim 1, wherein a distance between the first to third light emitting devices and a side surface of the molding part which is closest to the first to third light emitting devices is 16% or more of a minor axis width of the first to third light emitting devices.

12. A display device comprising:

a plurality of the light emitting device packages;

a driving substrate electrically connected with the plurality of light emitting device packages; and a black matrix of a matrix structure surrounding outer side faces of the plurality of light emitting device packages, wherein the light emitting device package is the light emitting device package according to the claim 1.

13. The display device of claim 12, wherein the black matrix includes an opening corresponding to one pixel, wherein the first to third light emitting devices is disposed in a constant curvature range from a center of the pixel corresponding to the opening, and wherein the constant curvature is 50% or less of the pixel size.

14. The light emitting device package of claim 1, wherein the fourth upper electrode is orthogonal to a central axis which passes a center of the substrate in the second direction, and is extended in the second direction from the fourth corner and has a shape bent in the first direction in an L-shape.

15. The light emitting device package of claim 14, wherein the fourth upper electrode is disposed between the first upper electrode and the third upper electrode, and is disposed between the second upper electrode and the third upper electrode.

16. The light emitting device package of claim 14, wherein an edge of the substrate includes a first edge between the first corner and the third corner, and wherein the fourth upper electrode is spaced from the first edge.

17. The light emitting device package of claim 14, wherein the fourth upper electrode is a common electrode.

* * * * *